US011979125B2

(12) United States Patent
Disanto (10) Patent No.: US 11,979,125 B2
(45) Date of Patent: May 7, 2024

(54) TECHNIQUES TO EXTERNALLY CONTROL AMPLIFIER GAIN

(71) Applicant: Analog Devices, Inc., Wilmington, MA (US)

(72) Inventor: Gregory Lawrence Disanto, Groton, MA (US)

(73) Assignee: Analog Devices, Inc., Wilmington, MA (US)

(*) Notice: Subject to any disclaimer, the term of this patent is extended or adjusted under 35 U.S.C. 154(b) by 295 days.

(21) Appl. No.: 17/690,629

(22) Filed: Mar. 9, 2022

(65) Prior Publication Data

US 2023/0291373 A1 Sep. 14, 2023

(51) Int. Cl.
| | | |
|---|---|---|
| *H03G 3/30* | (2006.01) | |
| *H03F 3/04* | (2006.01) | |
| *H03G 3/00* | (2006.01) | |
| *H03M 7/16* | (2006.01) | |
| *H03G 1/00* | (2006.01) | |

(52) U.S. Cl.
CPC ............ *H03G 3/002* (2013.01); *H03F 3/04* (2013.01); *H03G 3/30* (2013.01); *H03M 7/165* (2013.01); *H03G 1/0088* (2013.01); *H03G 2201/103* (2013.01)

(58) Field of Classification Search
CPC .... H03G 3/002; H03G 3/30; H03G 2201/103; H03G 1/0088; H03G 3/001; H03F 3/04; H03F 2203/45138; H03F 2203/45522; H03F 3/45475; H03M 7/165
USPC .......................................................... 330/69
See application file for complete search history.

(56) References Cited

U.S. PATENT DOCUMENTS

| | | | |
|---|---|---|---|
| 7,265,626 B2* | 9/2007 | Teo ...................... | H03G 1/0088 330/254 |
| 7,327,189 B2 | 2/2008 | Regier | |
| 7,432,766 B2 | 10/2008 | Gerstenhaber et al. | |
| 8,022,855 B2* | 9/2011 | Kijima ................ | H03M 1/0809 341/160 |
| 8,451,052 B2 | 5/2013 | Gilbert | |

(Continued)

FOREIGN PATENT DOCUMENTS

| | | |
|---|---|---|
| CN | 111130475 A | 5/2020 |
| CN | 116743099 | 9/2023 |

(Continued)

OTHER PUBLICATIONS

"LT1167: Single Resistor Gain Programmable, Precision Instrumentation Amplifier", Linear Technology Data Sheet, (1998), 22 pgs.

(Continued)

*Primary Examiner* — Khanh V Nguyen
(74) *Attorney, Agent, or Firm* — Schwegman Lundberg & Woessner, P.A.

(57) ABSTRACT

Techniques for setting a gain of an amplifier circuit in which the external resistor of the amplifier circuit is used to determine an internal gain setting to select. A voltage across the external resistor can be compared to an on-chip reference, and then used to program the desired gain. The techniques can mitigate or eliminate the need for a high-accuracy external resistor and can allow substantial improvements in initial gain accuracy and gain drift for existing boards and/or systems with only a bill of material change.

20 Claims, 7 Drawing Sheets

(56) References Cited

U.S. PATENT DOCUMENTS

| | | |
|---|---|---|
| 8,717,051 B2 | 5/2014 | Sullivan |
| 9,065,400 B2 | 6/2015 | Larson |
| 9,209,766 B1 | 12/2015 | Lindblom et al. |
| 10,103,742 B1 * | 10/2018 | Guo .................. H03M 1/145 |
| 10,601,384 B2 | 3/2020 | Danyuk et al. |
| 11,626,847 B2 * | 4/2023 | Plourde .............. H03F 3/45475 |
| | | 330/260 |
| 2005/0078024 A1 | 4/2005 | Harrington |

FOREIGN PATENT DOCUMENTS

| | | |
|---|---|---|
| DE | 102023105212 | 9/2023 |
| EP | 3621199 A1 | 3/2020 |

OTHER PUBLICATIONS

"PGA280 Zero-Drift, High-Voltage, Programmable Gain Instrumentation Amplifier", Texas Instruments Data Sheet, (Mar. 2020), 50 pgs.

"Precision Instrumentation Amplifier AD534", Analog Devices Data Sheet, (2007), 28 pgs.

"Single-Lead, Heart Rate Monitor Front End AD8232", Analog Devices Data Sheet, (2020), 32 pgs.

Kitchin, Charles, et al., "A Designer's Guide to Instrumentation Amplifiers", Analog Devices, Inc., (2006), 130 pgs.

* cited by examiner

TECHNIQUES TO EXTERNALLY CONTROL AMPLIFIER GAIN

FIELD OF THE DISCLOSURE

This document pertains generally, but not by way of limitation, to amplifier circuits and more specifically to programmable gain amplifier circuits.

BACKGROUND

Amplifiers can increase a signal property, e.g., current, voltage, power, other signal property, or a combination thereof, of an incoming signal, such as an electrical signal. One type of amplifier is a programmable gain amplifier. The programmable gain amplifier can include adjustable resistances in a feedback path (from an amplifier output to an amplifier input), an input path (from an input terminal to the amplifier input), or both to achieve varying gain levels.

Some traditional amplifiers use a single external resistor to set the gain. The resistance of the external resistor is used in the gain equation that defines the gain of the amplifier. The tolerances and inaccuracies of the external resistor can directly impact the overall performance of the amplifier.

SUMMARY OF THE DISCLOSURE

This disclosure describes, among other things, techniques for setting a gain of an amplifier circuit in which the external resistor of the amplifier circuit is used to determine an internal gain setting to select. This approach is in contrast with other approaches in which a resistance value of the external resistor is used in the actual gain equation that determines the gain of the amplifier circuit. Here, a voltage across the external resistor can be compared to an on-chip reference, and then used to program the desired gain. These techniques can mitigate or eliminate the need for a high-accuracy external resistor and can allow substantial improvements in initial gain accuracy and gain drift for existing boards and/or systems with only a bill of material change.

In some aspects, this disclosure is directed to a programmable gain amplifier circuit comprising: at least one device pin configured to be coupled to an external gain setting resistive component; a resistive component string including a plurality of resistive components; a comparator string having a plurality of comparator circuits, the plurality of comparator circuits including: first inputs coupled to receive voltages generated by corresponding ones of the plurality of resistive components; and second inputs coupled to receive a voltage generated by the external gain setting resistive component; and a logic circuit having a plurality of inputs coupled to corresponding outputs of the plurality of comparator circuits, wherein an output of the logic circuit is configured to set a gain of the programmable gain amplifier circuit based on outputs of the plurality of comparator circuits.

In some aspects, this disclosure is directed to a programmable gain amplifier circuit comprising: a device pin configured to be coupled to an external gain setting resistive component; a resistive component string including a plurality of resistive components; a first current source coupled to a first end of the resistive component string; a second current source coupled to the external gain setting resistive component; a comparator string having a plurality of comparator circuits, the plurality of comparator circuits including: first inputs coupled to corresponding ones of the plurality of resistive components; and second inputs coupled to receive a voltage generated by the external gain setting resistive component and the second current source; and a logic circuit having a plurality of inputs coupled to corresponding outputs of the plurality of comparator circuits, wherein an output of the logic circuit is configured to set a gain of the programmable gain amplifier circuit based on outputs of the plurality of comparator circuits.

In some aspects, this disclosure is directed to a method of operating a programmable gain amplifier circuit, the method comprising: generating a plurality of voltages across corresponding resistive components of a resistive component string; comparing corresponding ones of the plurality of voltages to a reference voltage generated across an external gain setting resistive component; determining a code based on the comparison; generating a control signal based on the code; and controlling, based on the control signal, at least one switch to connect a resistive component to set a gain of the programmable gain amplifier circuit.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Many traditional amplifier circuits use a single external resistor to set a gain of the amplifier circuit. The resistance value of the external resistor is used in the actual gain equation that determines the gain of the amplifier circuit. The tolerances and inaccuracies of the external resistor can directly impact overall performance of the amplifier circuit.

Some amplifier circuits, such as programmable gain instrumentation amplifier circuits (PGIA), can achieve superior gain accuracy because they have all the gain setting resistors integrated on-chip. Unfortunately, these PGIAs may not conform to the same packages and pinouts of their predecessors, and more simplistic approaches that deliver one or two on-chip gains can lack flexibility.

This disclosure describes, among other things, techniques for setting a gain of an amplifier circuit in which the external resistor of the amplifier circuit is used to determine an internal gain setting to select. This approach is in contrast with other approaches in which a resistance value of the external resistor is used in the actual gain equation that determines the gain of the amplifier circuit. Here, a voltage across the external resistor can be compared to an on-chip reference, and then used to program the desired gain. These techniques can mitigate or eliminate the need for a high-accuracy external resistor and can allow substantial improvements in initial gain accuracy and gain drift for existing boards and/or systems with only a bill of material change.

Figure 1:
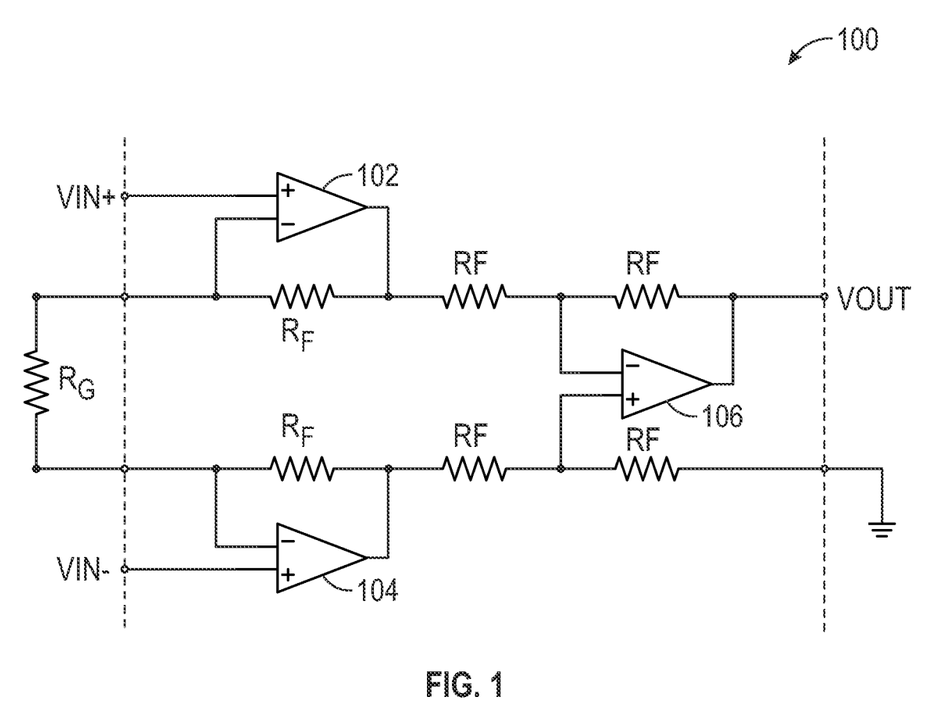
FIG. 1 is an example of an amplifier circuit.

FIG. 1 is an example of an amplifier circuit. The amplifier circuit 100 is an example of a programmable gain instrumentation amplifier circuit (PGIA) that includes three operational amplifiers 102-106 configured with a network of high quality on-chip resistors. Two of the operational amplifiers, namely amplifiers 102, 104, can form an input amplifier section and can serve to provide the user with high-impedance differential inputs while also providing gain. The third amplifier 106 can be connected as a difference amplifier and can serve to convert the amplified differential signal to a ground-referenced, buffered output.

The final gain of the input amplifier section can be determined by a ratio of on-chip resistors RF and the off-chip (external) discrete resistor RG, which is given by the gain equation (1+(2*RF/RG)). Although the approach of FIG. 1 can provide a convenient way to have user-adjustable gain, it places a practical limitation on the accuracy of that gain.

Gain inaccuracy can be caused by the lack of correlation between the on-chip resistors RF and the external resistor RG. The resistors RF can be trimmed to an absolute value within about 0.1%, then any tolerance on the external resistor RG can additionally degrade the gain error. The lack of correlation of the temperature coefficients of the resistors RF and the resistor RG can also cause the gain of the amplifier circuit to change over temperature. The initial gain error and gain drift specifications in datasheets reflect the performance of the on-chip components and assume that a perfect external resistor RG is used. In practice, the tolerance and temperature coefficient of the external resistor RG limit performance and resistors with tighter tolerances and lower temperature coefficient tend to be more expensive and less abundant.

Instead of requiring the user to provide the external resistor RG, some PGIAs have integrated the resistor RG to track the resistors RF and achieve significantly better gain accuracy. While this is effective, basic offerings that achieve one or two gain settings can lack flexibility. More recent PGIA developments are an improvement in terms of flexibility because they can offer a much larger number of discrete gains while still reaping the gain accuracy benefit of having all the resistors integrated. Unfortunately, these PGIA parts do not fit into standard instrumentation amplifier footprints.

As described below, various techniques of this disclosure can provide a way to make modern amplifier designs conform to standard footprints, allowing existing systems to improve gain accuracy with a change to a bill of materials. A voltage across the external resistor RG, e.g., a cheap, standard component, can be compared to an on-chip reference, and then used to program the desired gain, such as by using a logic circuit, such as including an encoder, to drive the gain selection of the amplifier circuit. In this manner, the external resistor RG is used to decide which gain setting to use, rather than as part of the gain equation to determine the gain, and all the analog gain-setting resistors are integrated on-chip allowing significant improvement in gain accuracy.

Figure 2:
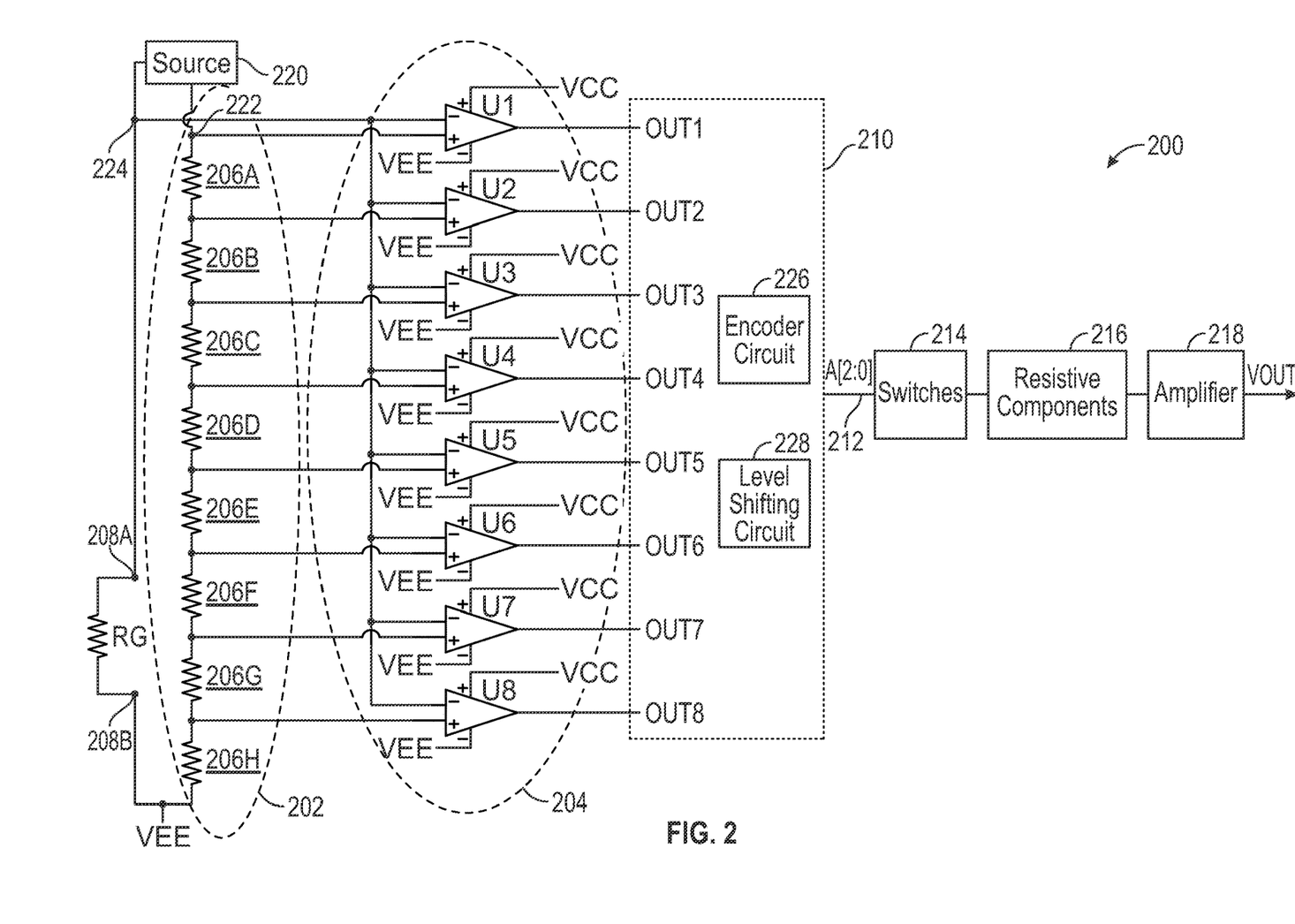
FIG. 2 is an example of a programmable gain amplifier circuit that can implement various techniques of this disclosure.

FIG. 2 is an example of a programmable gain amplifier circuit that can implement various techniques of this disclosure. The programmable gain amplifier circuit 200 can include a resistive component string 202 coupled to a comparator string 204. The resistive component string 202 can include a plurality of resistive components, e.g., a resistive voltage divider, as shown in the non-limiting example of FIG. 2 as eight resistive components 206A-206H. Other component strings can have more than eight resistive components or less than eight resistive components. The comparator string 204 can include a plurality of comparator circuits, shown in the non-limiting example of FIG. 2 as comparator circuits U1-U8. Other comparator strings can have more than eight comparators or less than eight resistive comparators.

The programmable gain amplifier circuit 200 can include one or more device pins 208A, 208B that can be coupled to an external gain setting resistive component RG, such as a resistor. By using various techniques of this disclosure, the comparator circuits U1-U8 of the comparator string 204 can compare a voltage generated across the external gain setting resistive component RG to voltages generated across corresponding ones of the plurality of resistive components and a logic circuit 210 can set a gain of the programmable gain amplifier circuit based on the outputs of the plurality of comparator circuits.

More particularly, the comparator circuits U1-U8 can include first inputs, such as non-inverting input terminals, coupled to receive voltages generated by corresponding ones of the plurality of resistive components, and second inputs, such as inverting input terminals, coupled to receive a voltage generated at node 224, such as across the external gain setting resistive component RG.

In some examples, the comparator string 204 is configured to generate a thermometer code. The resistive component string 202, e.g., resistive voltage divider, can operate off of a source 220, e.g., voltage source or current source, coupled to node 222, to provide the reference voltages to the non-inverting input terminals of the comparators U1-U8 of the comparator string 204, and to node 224. The voltage at node 224 is coupled or applied to the inverting input terminals of the comparators U1-U8 of the comparator string 204.

As an example, the reference voltage for each comparator of the comparator string 204 is one least significant bit (LSB) higher than the reference voltage for the comparator immediately below it. The outputs of the comparators U1-U8 collectively can provide a "thermometer code" that corresponds to the magnitude of the external gain setting resistive component RG.

The logic circuit 210 can include a plurality of inputs, such as inputs OUT1-OUT8 in FIG. 2, coupled to corresponding outputs of the comparator circuits U1-U8. The logic circuit 210 can generate a control signal based on the outputs of the comparator circuit U1-U8 at an output 212 of the logic circuit 210 to set a gain of the programmable gain amplifier circuit 200. For example, the logic circuit 210 can generate a 3-bit digital output control signal A[2:0] to control one or more switches 214 to selectively couple one or more resistive components 216 to an amplifier circuit 218, such as coupling one or more resistive components 216 in a negative feedback configuration around the amplifier circuit 216. The selected resistive component(s) can program the gain of the amplifier circuit 218.

In some examples, the logic circuit 210 can include an encoder circuit 226 to convert the thermometer code to a binary code. As an example, the encoder circuit 226 can include OR gates configured and arranged to receive the thermometer code and output a binary code.

In some examples, if a higher supply voltage VCC is used, such as greater than about 5V, it can be desirable to include a level shifting circuit 228 to level shift the output of the logic circuit 210 because the resistive component string 202 can float with input.

Figure 3:
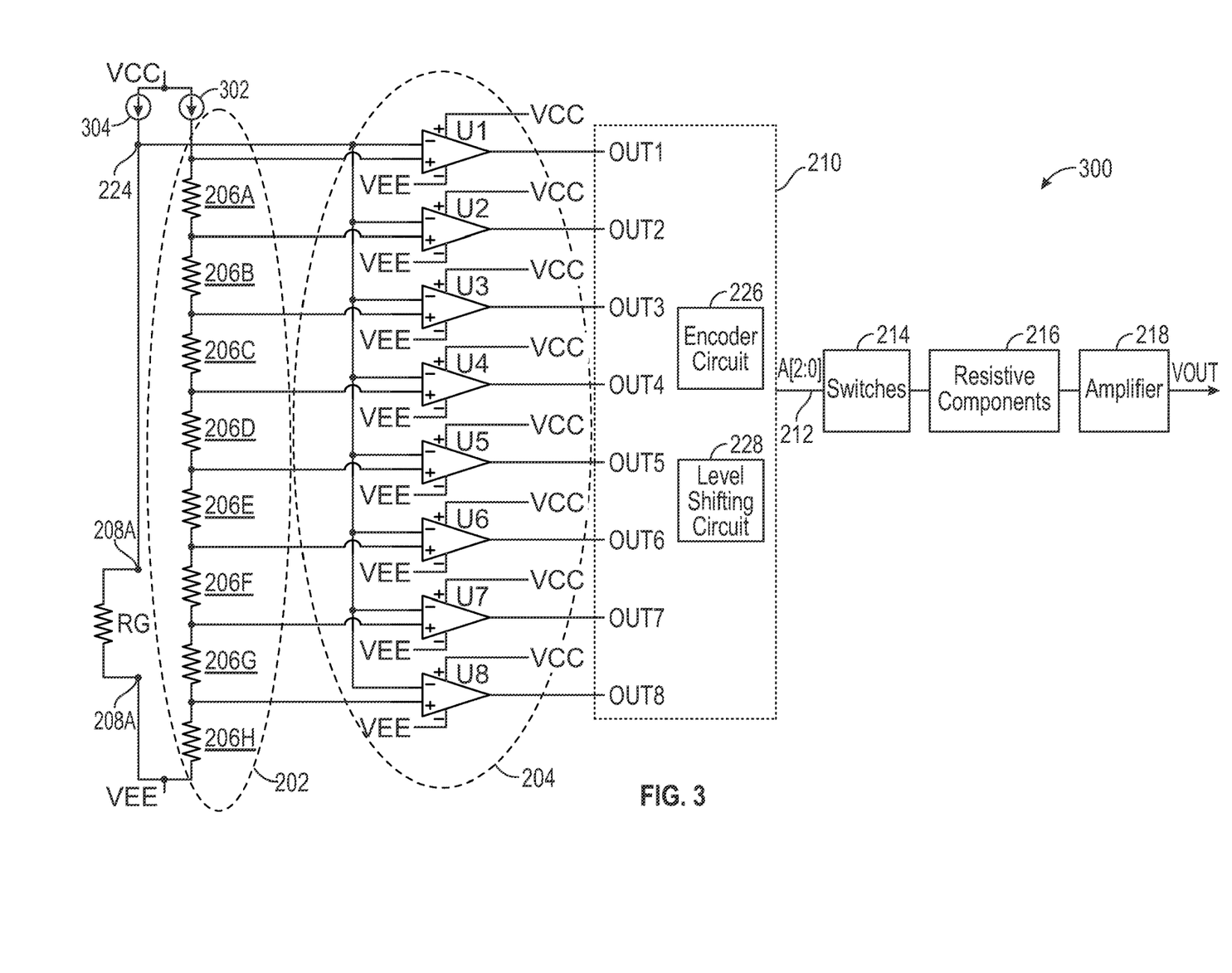
FIG. 3 is another example of a programmable gain amplifier circuit that can implement various techniques of this disclosure.

FIG. 3 is another example of a programmable gain amplifier circuit 300 that can implement various techniques of this disclosure. Many of the components in FIG. 3 are similar to those shown and described above with respect to FIG. 2 and, for purposes of conciseness, will not be described in detail again.

In the example shown in FIG. 3, the source 220 of FIG. 2 can include a first current source 302 coupled to a first end of the resistive component string 202 and a second current source 304 coupled to the external gain setting resistive component RG. The first current source 302 and the second current source 304 can generate substantially identical known currents that can be injected into the resistive component string 202 and the external gain setting resistive component RG.

As described above, the voltage across the external gain setting resistive component RG can be compared by the comparators of the comparator string 204 to reference voltages generated across the resistive components of the resistive component string 202. The logic circuit 210 can encode the outputs of the comparators U1-U8 to drive a gain selection of the programmable gain amplifier circuit 300. In this way, the external gain setting resistive component RG is used to decide which gain setting to use, rather than being part of the gain equation, and all the analog gain-setting resistors are integrated on-chip allowing significant improvement in gain accuracy.

Figure 4:
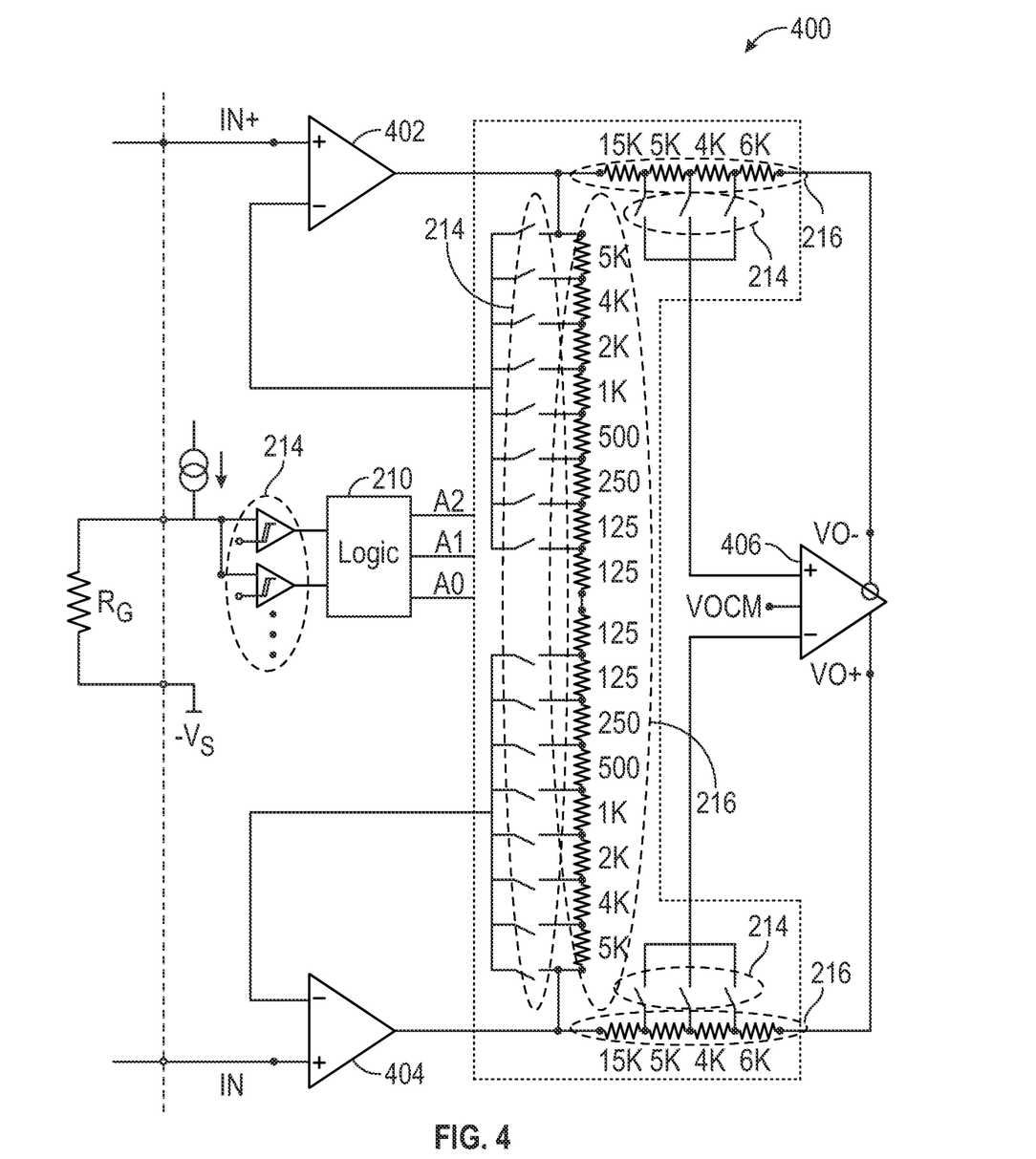
FIG. 4 is another example of a programmable gain amplifier circuit that can implement various techniques of this disclosure.

FIG. 4 is another example of a programmable gain amplifier circuit 400 that can implement various techniques of this disclosure. The programmable gain amplifier circuit 400 can include at least two amplifier circuits. For example, in the non-limiting example shown, the programmable gain amplifier circuit 400 can include a first amplifier circuit 402, a second amplifier circuit 404, and a third amplifier circuit 406. The third amplifier circuit 406 is an example of the amplifier circuit 218 of FIGS. 2 and 3. In some examples, the third amplifier circuit 406 can be arranged in a negative feedback configuration.

In some examples, the programmable gain amplifier circuit 400 can be arranged in a programmable gain instrumentation amplifier configuration. In some such examples, the first amplifier circuit 402 and second amplifier circuit 404 can form part of an input stage and the third amplifier circuit 406 can form part of a differential stage, with inputs of the differential stage coupled to outputs of the input stage.

As seen in FIG. 4, various switches 214 can couple resistive components 216 of differing resistances to set a gain of the programmable gain amplifier circuit 400 using digital outputs A3-A1 of a logic circuit, such as the logic circuit 210 of FIG. 2, which are based on the outputs of the plurality of comparator circuits. It should be understood that the resistance values of the resistive components 216 are non-limiting values and are included only for purposes of illustration.

Figure 5:
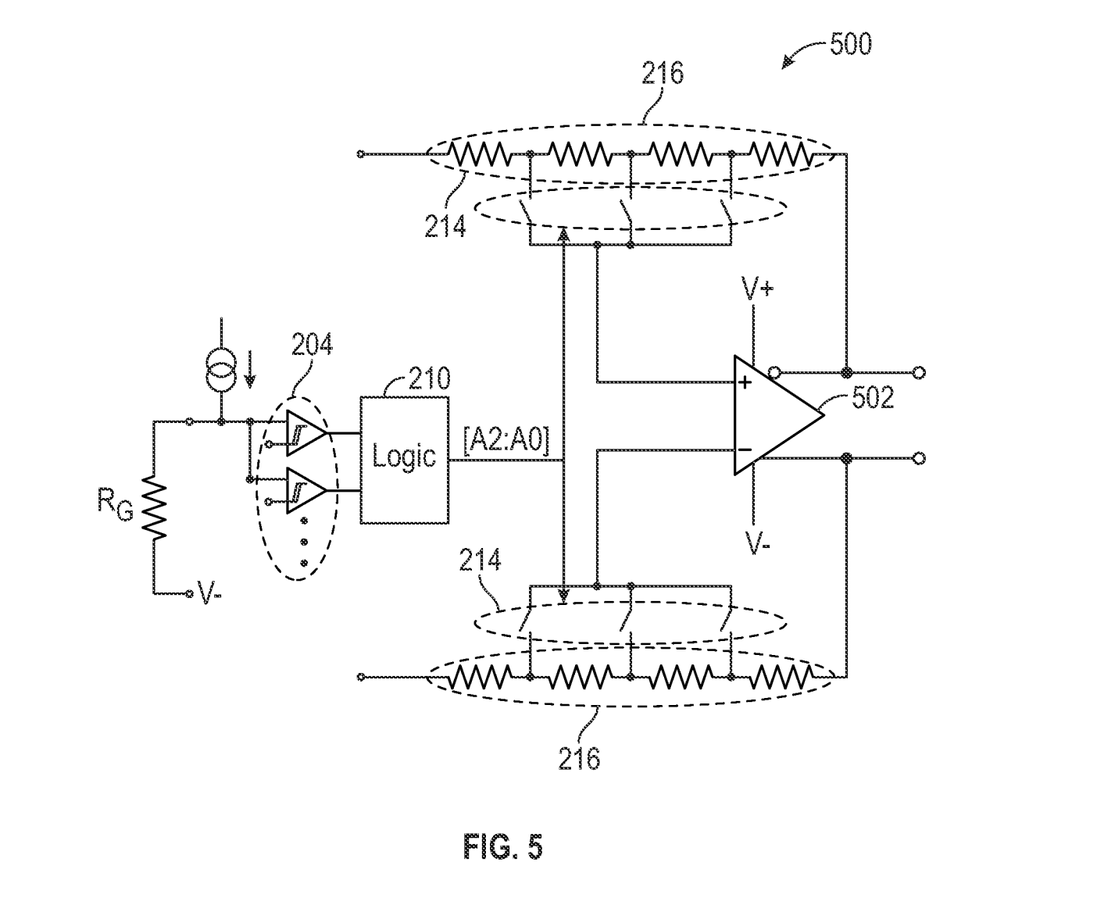
FIG. 5 is another example of a programmable gain amplifier circuit that can implement various techniques of this disclosure.

FIG. 5 is another example of a programmable gain amplifier circuit 500 that can implement various techniques of this disclosure. In some examples, the programmable gain amplifier circuit 500 can include an amplifier circuit 502 having a differential input to receive a differential input signal at its non-inverting input and inverting input terminals. In some such examples, the amplifier circuit 502 can include a differential output, as shown in FIG. 5, and as such be fully differential. In other examples, the amplifier circuit 502 can include a single-end output terminal. The amplifier circuit 502 is an example of the amplifier circuit 218 of FIG. 2. In some examples, the amplifier circuit 502 can be arranged in a negative feedback configuration.

As seen in FIG. 5, various switches 214 can couple resistive components 216 of differing resistances to set a gain of the programmable gain amplifier circuit 500 using a digital control signal A[N:0] generated by a logic circuit, such as the logic circuit 210 of FIG. 2, which are based on the outputs of the plurality of comparator circuits.

Figure 6:
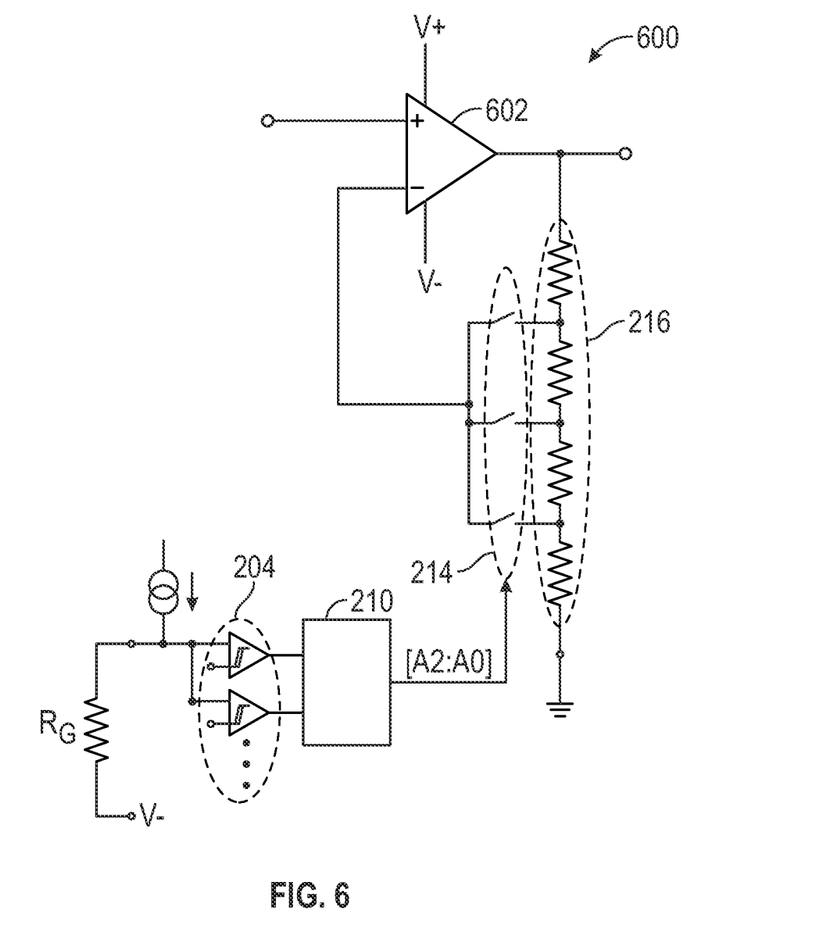
FIG. 6 is another example of a programmable gain amplifier circuit that can implement various techniques of this disclosure.

FIG. 6 is another example of a programmable gain amplifier circuit 600 that can implement various techniques of this disclosure. In some examples, the programmable gain amplifier circuit 600 can include an amplifier circuit 602 arranged in an operational amplifier configuration. The amplifier circuit 602 is an example of the amplifier circuit 218 of FIG. 2. In some examples, the amplifier circuit 602 can be arranged in a negative feedback configuration.

As seen in FIG. 6, various switches 214 can couple resistive components 216 of differing resistances to set a gain of the programmable gain amplifier circuit 600 using a digital control signal A[N:0] generated by a logic circuit, such as the logic circuit 210 of FIG. 2, which are based on the outputs of the plurality of comparator circuits.

Figure 7:
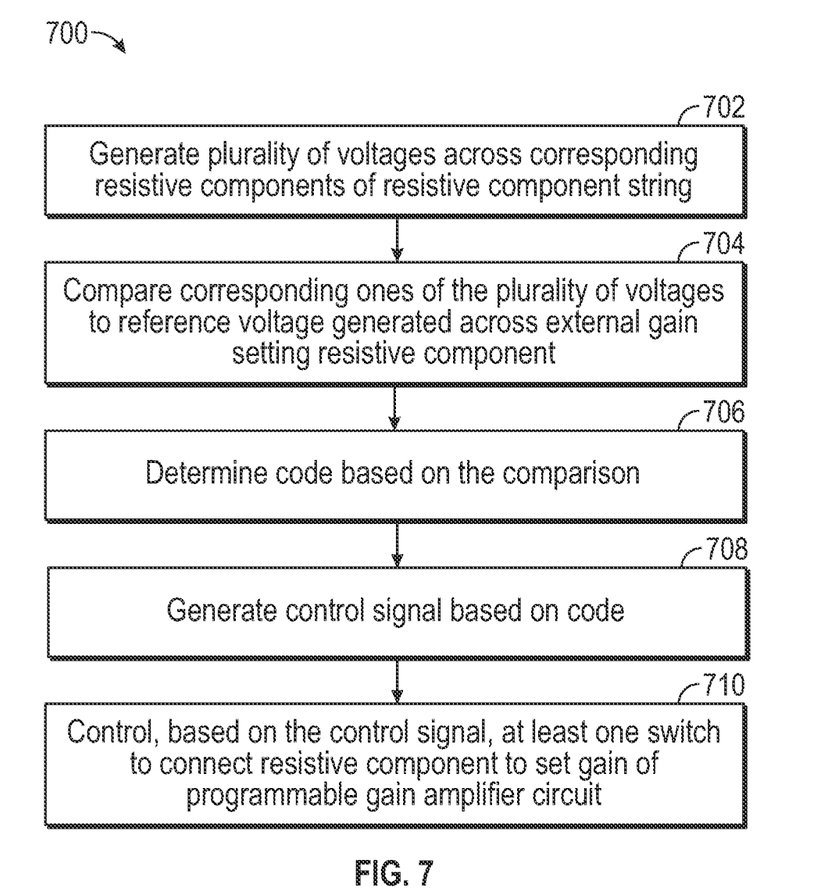
FIG. 7 is a flow diagram of an example of a method of operating a programmable gain amplifier circuit.

FIG. 7 is a flow diagram of an example of a method 700 of operating a programmable gain amplifier circuit. The circuits shown in FIGS. 2-6 can be used to implement the method 700.

At block 702, the method 700 can include generating a plurality of voltages across corresponding resistive components of a resistive component string. For example, the first current source 302 of FIG. 3 can generate a plurality of voltages across corresponding resistive components 206A-206H of the resistive component string 202 of FIG. 3.

At block 704, the method 700 can include comparing corresponding ones of the plurality of voltages to a reference voltage generated across an external gain setting resistive component. For example, comparators U1-U8 of the comparator string 204 of FIG. 3 can compare corresponding ones of the plurality of voltages generated across the resistive components of the resistive component string 202 to a reference voltage generated across the external gain setting resistive component RG.

At block 706, the method 700 can include determining a code based on the comparison. For example, the logic circuit 210 of FIG. 3 can determine a thermometer code based on the comparison.

At block 708, the method 700 can include generating a control signal based on the code. For example, the logic circuit 210 of FIG. 3 can generate a digital output control signal based on the code.

At block 710, the method 700 can include controlling, based on the control signal, at least one switch to connect a resistive component to set a gain of the programmable gain amplifier circuit. For example, the logic circuit 210 can control one or more switches 214 to selectively couple one or more resistive components 216 to an amplifier circuit 218, such as coupling one or more resistive components 216 in a negative feedback configuration around the amplifier circuit 216. The selected resistive component(s) can program the gain of the amplifier circuit 218.

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMS), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A programmable gain amplifier circuit comprising:
   at least one device pin configured to be coupled to an external gain setting resistive component;
   a resistive component string including a plurality of resistive components;
   a comparator string having a plurality of comparator circuits, the plurality of comparator circuits including:
      first inputs coupled to receive voltages generated by corresponding ones of the plurality of resistive components; and
      second inputs coupled to receive a voltage generated by the external gain setting resistive component; and
   a logic circuit having a plurality of inputs coupled to corresponding outputs of the plurality of comparator circuits, wherein an output of the logic circuit is configured to set a gain of the programmable gain amplifier circuit based on outputs of the plurality of comparator circuits.

2. The programmable gain amplifier circuit of claim 1, wherein the comparator string is configured to generate a thermometer code.

3. The programmable gain amplifier circuit of claim 2, wherein the logic circuit is configured to convert the thermometer code to a binary code.

4. The programmable gain amplifier circuit of claim 1, wherein the logic circuit includes a level shifting circuit to adjust a voltage level of an output of the logic circuit.

5. The programmable gain amplifier circuit of claim 1, comprising:
   first and second amplifier circuits,
   wherein the first and second amplifier circuits are arranged in an instrumentation amplifier configuration.

6. The programmable gain amplifier circuit of claim 1, comprising:
   an amplifier circuit including a differential input to receive a differential input signal.

7. The programmable gain amplifier circuit of claim 6, wherein the amplifier circuit includes a differential output to generate a differential output signal.

8. The programmable gain amplifier circuit of claim 1, comprising:
   an amplifier circuit arranged in a negative feedback configuration.

9. The programmable gain amplifier circuit of claim 1, comprising:
   a first current source coupled to a first end of the resistive component string; and
   a second current source coupled to the external gain setting resistive component, wherein the second inputs of the plurality of comparator circuits are coupled to receive the voltage generated by the external gain setting resistive component and the second current source.

10. A programmable gain amplifier circuit comprising:
a device pin configured to be coupled to an external gain setting resistive component;
a resistive component string including a plurality of resistive components;
a first current source coupled to a first end of the resistive component string;
a second current source coupled to the external gain setting resistive component;
a comparator string having a plurality of comparator circuits, the plurality of comparator circuits including:
first inputs coupled to corresponding ones of the plurality of resistive components; and
second inputs coupled to receive a voltage generated by the external gain setting resistive component and the second current source; and
a logic circuit having a plurality of inputs coupled to corresponding outputs of the plurality of comparator circuits, wherein an output of the logic circuit is configured to set a gain of the programmable gain amplifier circuit based on outputs of the plurality of comparator circuits.

11. The programmable gain amplifier circuit of claim 10, wherein the comparator string is configured to generate a thermometer code.

12. The programmable gain amplifier circuit of claim 11, wherein the logic circuit is configured to convert the thermometer code to a binary code.

13. The programmable gain amplifier circuit of claim 10, wherein the logic circuit includes a level shifting circuit to adjust a voltage level of an output of the logic circuit.

14. The programmable gain amplifier circuit of claim 10, comprising:
first and second amplifier circuits,
wherein the first and second amplifier circuits are arranged in an instrumentation amplifier configuration.

15. The programmable gain amplifier circuit of claim 10, comprising:
an amplifier circuit including a differential input to receive a differential input signal.

16. The programmable gain amplifier circuit of claim 10, comprising:
an amplifier circuit arranged in a negative feedback configuration.

17. A method of operating a programmable gain amplifier circuit, the method comprising:
generating a plurality of voltages across corresponding resistive components of a resistive component string;
comparing corresponding ones of the plurality of voltages to a reference voltage generated across an external gain setting resistive component;
determining a code based on the comparison;
generating a control signal based on the code; and
controlling, based on the control signal, at least one switch to connect a resistive component to set a gain of the programmable gain amplifier circuit.

18. The method of claim 17, wherein determining the code based on the comparison includes:
determining a thermometer code.

19. The method of claim 18, comprising:
converting the thermometer code to a binary code.

20. The method of claim 17, comprising:
adjusting a voltage level of an output of a logic circuit.

* * * * *